United States Patent [19]

Hopwood et al.

[11] Patent Number: 4,639,688
[45] Date of Patent: Jan. 27, 1987

[54] WIDE-BAND PHASE LOCKED LOOP AMPLIFIER APPARATUS

[75] Inventors: Francis W. Hopwood, Severna Park; Stephen P. Caldwell, Linthicum; Martin J. Decker, Baltimore, all of Md.

[73] Assignee: The United States of America as represented by the Secretary of the Air Force, Washington, D.C.

[21] Appl. No.: 724,714

[22] Filed: Apr. 18, 1985

[51] Int. Cl.[4] .................................................. H03L 7/00
[52] U.S. Cl. ........................................ 331/10; 331/17; 331/25
[58] Field of Search ............................. 331/10, 17, 25; 329/122; 375/120

[56] References Cited

U.S. PATENT DOCUMENTS

| Re. 28,452 | 6/1975 | Lance | 331/17 |
|---|---|---|---|
| 3,063,021 | 11/1962 | Farrow | 331/10 |
| 3,495,184 | 2/1970 | Perkins, Jr. et al. | 331/10 |
| 3,909,735 | 9/1975 | Anderson et al. | 329/122 |
| 4,107,624 | 8/1978 | Turner | 331/10 X |

Primary Examiner—Eugene R. LaRoche
Assistant Examiner—Robert J. Pascal
Attorney, Agent, or Firm—William Stepanishen; Donald J. Singer

[57] ABSTRACT

A wide-band amplifier apparatus utilizing a low frequency and a high frequency phase lock loop to achieve low phase delay at the loop bandwidth. The bandwidth products of the low and high frequency loop paths are combined and applied to the voltage controlled oscillator to minimize phase delay and to achieve a more stable loop.

7 Claims, 7 Drawing Figures

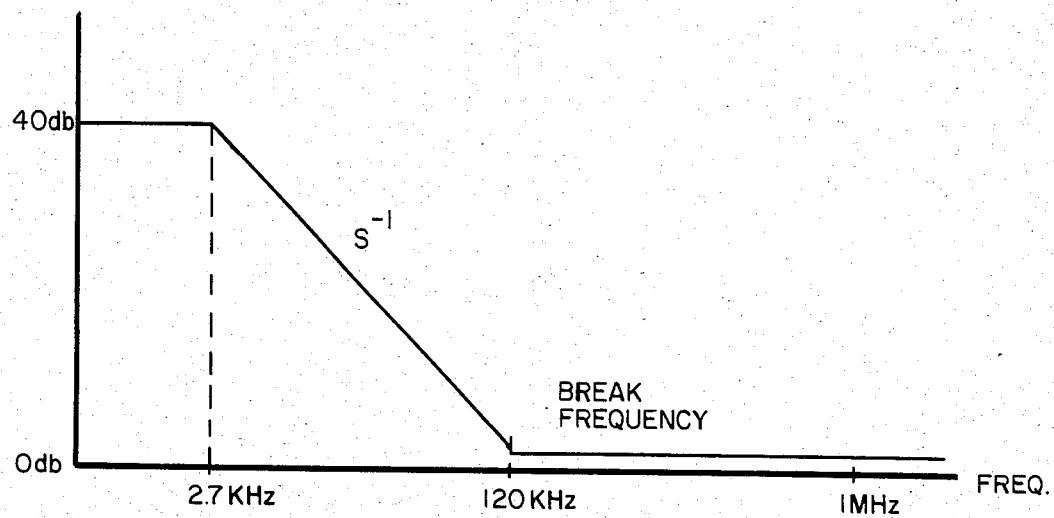
FIG. 3
FIG. 4
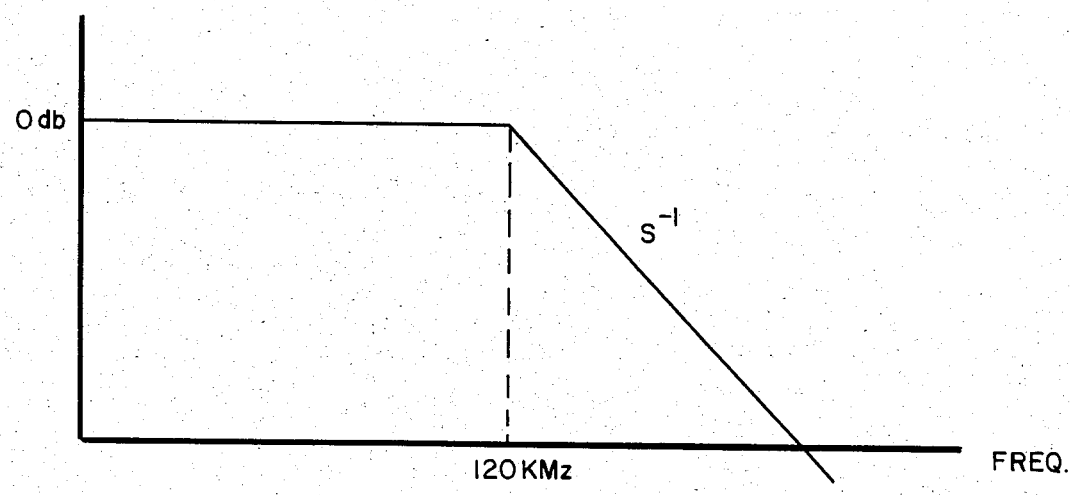

WIDE-BAND PHASE LOCKED LOOP AMPLIFIER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to phase locked loop amplifiers, and in particular to a wide-band phase locked loop amplifier apparatus.

Phase locked-loop (PLL) systems typically include a voltage controlled oscillator (VCO) to produce the output signal. The operation of voltage controlled oscillators is typically non-linear in that $f=KV$ where f is the output frequency, K is a constant and V is the input voltage. Where the desired output frequency changes in some predetermined manner as a function of time, it is known to incorporate a memory which stores voltage signals. The stored signals provide the appropriate voltage input to the voltage controlled oscillator as a function of time and include the correcting voltages to compensate for the voltage controlled oscillator non-linearities.

The memory, which is usually a digital memory, is combined with a digital-to-analog (D/A) converter to produce voltage signals as a function of time to be added to the conventional phase error signal. The resulting composite signal, when applied to the voltage controlled oscillator input, is desired to be of correct shape (vs. time) as to yield minimum phase error in the voltage controlled oscillator output. Such a modified system in the present art may fail to reduce the errors to the minimum since linearity errors in the voltage controlled oscillator change with temperature, long-range time and with changes in phase locked loop components.

The phase lock loops which are utilized in current stabilized local oscillators (Stalos) are operated as tracking filters. These tracking filters are utilized to suppress both reference noise which occurs outside the loop bandwidth and the voltage controlled oscillator (VCO) noise which occurs inside the loop bandwidth. Since the reference signal is crystal generated, the reference noise is orders of magnitude better than the voltage controlled oscillator (VCO) noise making wide-band phase lock loops desirable. The added advantage of using wide-band loops is the faster acquisition and lock-up times. In the past, wide-band loops were difficult to achieve because of the phase delay which was introduced by the loop amplifier and loops greater than two MHz were unstable.

The present wide-band phase locked loop amplifier apparatus solves the problem of the added phase delay in the loop amplifier by using two frequency paths. By using this technique, the active loop amplifier is able to achieve gain-bandwidth products of 10 to 20% of the loop bandwidth. In the present invention, the active amplifier gain-bandwidth product was 5 to 10 times the loop bandwidth to ensure an acceptable phase margin; a reduction by a factor of 50 in the requirement of the active amplifier. The existing loops could be easily altered whenever unity gain loop amplifiers are used, to minimize phase delay, and to make a more stable loop.

SUMMARY OF THE INVENTION

The present invention utilizes an active loop amplifier having a low frequency loop and a high frequency loop to achieve fast acquisition and lockup time and to minimize phase delay while producing a more stable loop. Two mixing circuits which include summing networks are utilized to provide a high frequency loop with no phase delay at unity gain and a low frequency loop which operates below the break frequency of the active loop amplifier.

It is one object of the present invention, therefore, to provide an improved wide-band phase locked loop amplifier apparatus.

It is another object of the invention to provide an improved wide-band phase locked loop amplifier apparatus wherein two frequency loops are utilized to substantially reduce the phase delay at the loop bandwidth.

It is another object of the invention to provide an improved wide-band phase locked loop amplifier apparatus wherein an active loop amplifier with gain-bandwidth products of 10 to 20% of the loop bandwidth are utilized.

It is another object of the invention to provide an improved wide-band phase locked loop amplifier apparatus wherein a unity gain loop amplifier is utilized to minimize phase delay and to provide a more stable loop.

It is another object of the invention to provide an improved wide-band phase locked loop amplifier apparatus wherein two mixers are utilized in a summing network to achieve negligible phase delay at the loop bandwidth.

These and other advantages, objects and features of the invention will become more apparent after considering the following description taken in conjunction with the illustrative embodiment in the accompanying drawings.

BRIEF DESCRIPTION OF THE DRAWINGS

FIG. 3 is a graphical representation of the low frequency loop showing a type two loop at frequencies below the break frequency of the active amplifier, FIG. 4 is a graphical representation of the output of the active loop amplifier which is low passed by an R-C network at a common break frequency.

DESCRIPTION OF THE PREFERRED EMBODIMENT

Figure 1:
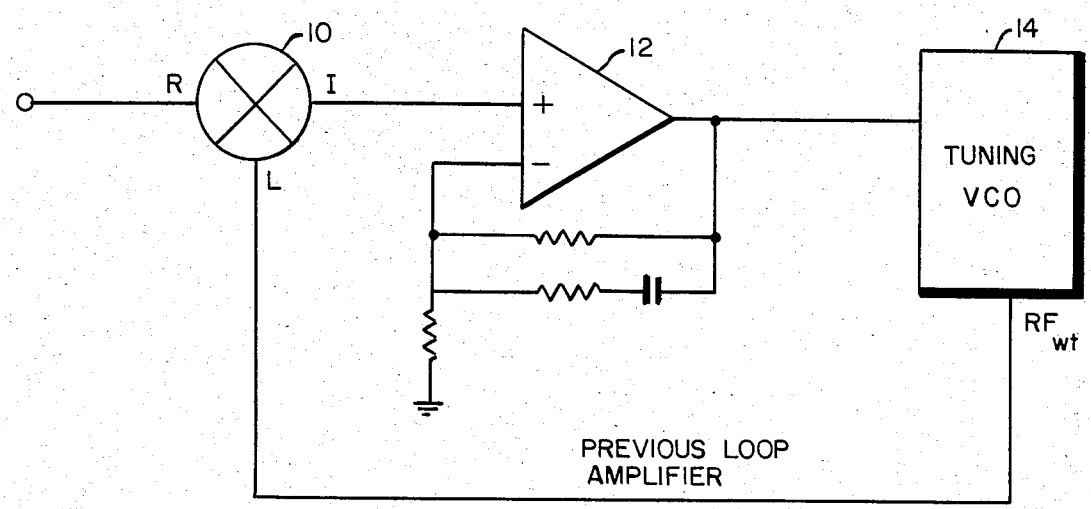
FIG. 1 is a block diagram of a prior art phase locked loop amplifier apparatus.

In FIG. 1, there is shown a block diagram of a prior art locked loop amplifier receiving an input reference signal (REF) at port R of the mixer unit 10. The mixer unit 10 receives an RF signal from the voltage controlled oscillator (VCO) 12 at port L. The reference signal and the RF signal are combined in mixer unit 10 and are applied by means of port I to the noninverting (+) input terminal of the loop amplifier 12. A feedback loop is arranged from the output terminal of the loop amplifier 12 to the inverting (−) input terminal of the amplifier. The present circuit is an example of a wideband locked loop amplifier apparatus which has a fast acquisition and lock-up time but has inherent phase delays in the lock-up loop.

Figure 2:
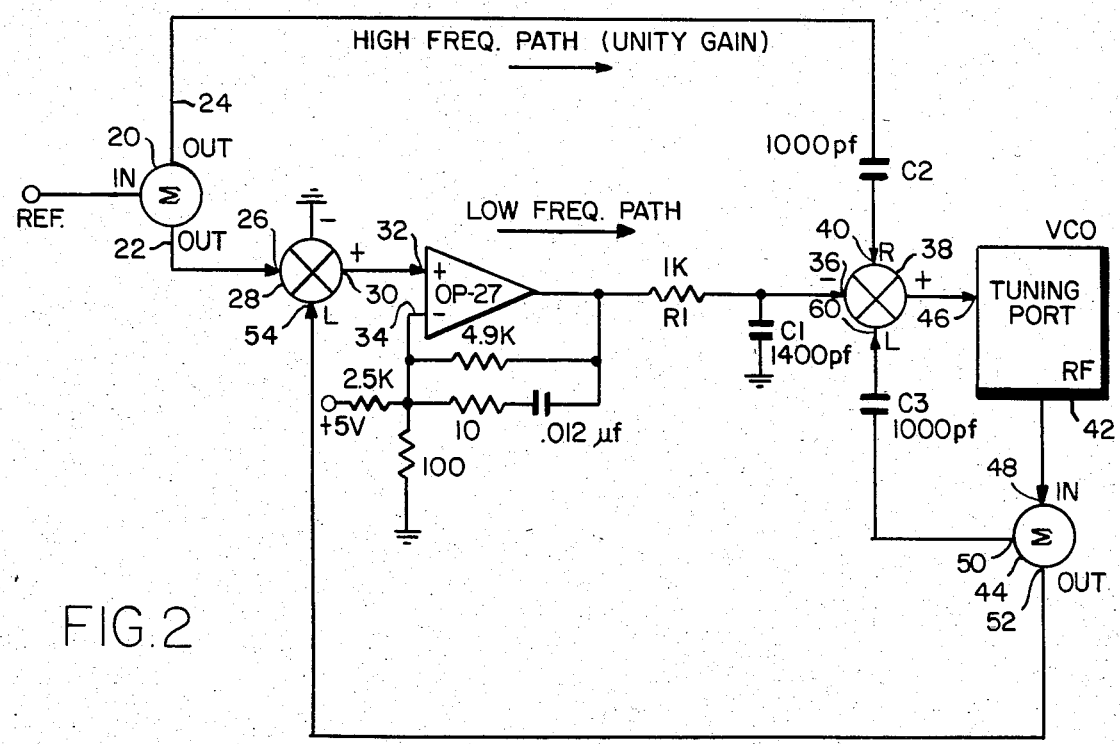
FIG. 2 is a schematic diagram of the wide-band phase locked loop amplifier apparatus according to the present invention.

Referring now to FIG. 2, there is shown a schematic diagram of a wide-band phase locked loop amplifier apparatus utilizing a signal splitting unit 20 to receive the input reference signal, REF. A first output port 22 applies the input reference signal to the input port 26 of mixer unit 28. The signal at the output port 30 of mixer unit 28 is applied to the noninverting (+) input terminal 32 of the loop amplifier (operation amplifier) op-27. The feedback network from the output of the loop amplifier op-27 to the inverting (−) input terminal 34 operates in conjunction with the amplifier to perform the integration function. The output from the loop amplifier op-27 is applied through the low pass filter which is comprised of resistor R1 and capacitor C1 to the input port 36 of mixer unit 38.

The low frequency path, as indicated by an arrow in FIG. 2, comprises the series path between the output port 30 of mixer 28 and the input port 36 of mixer unit 38 which includes the loop amplifier op-27 that performs an integration and the low pass filter network, R1, C1 that removes high frequency signals. The high frequency path which provides unity gain comprises the signal path from the output port 24 of signal splitting unit 20 to the R input port 40 of mixer unit 38. The high frequency path includes a series capacitor C2 to block any DC components in this path. The output signal from the mixer unit 38 is applied to the tuning port 46 of the voltage controlled oscillator (VCO) 42. An RF signal from the voltage controlled oscillator unit is applied to the input port 48 of signal splitting unit 44. By means of output port 50 of the signal splitting unit 44, the RF signal is applied through capacitor C3 to the L input port 60 of mixer unit 38. The respective signals which are applied to mixer unit 38 are combined therein to form a second composite signal that is, applied to the voltage controlled oscillator unit 42. The RF signal in signal splitting unit 44 is applied by means of output port 52 to the L input port 54 of mixer unit 28. The respective signals which are applied to mixer unit 28 are therein combined to form a first composite signal that is applied to the noninverting (+) input terminal 32 of the loop amplifier op-27 for integration.

Figure 5:
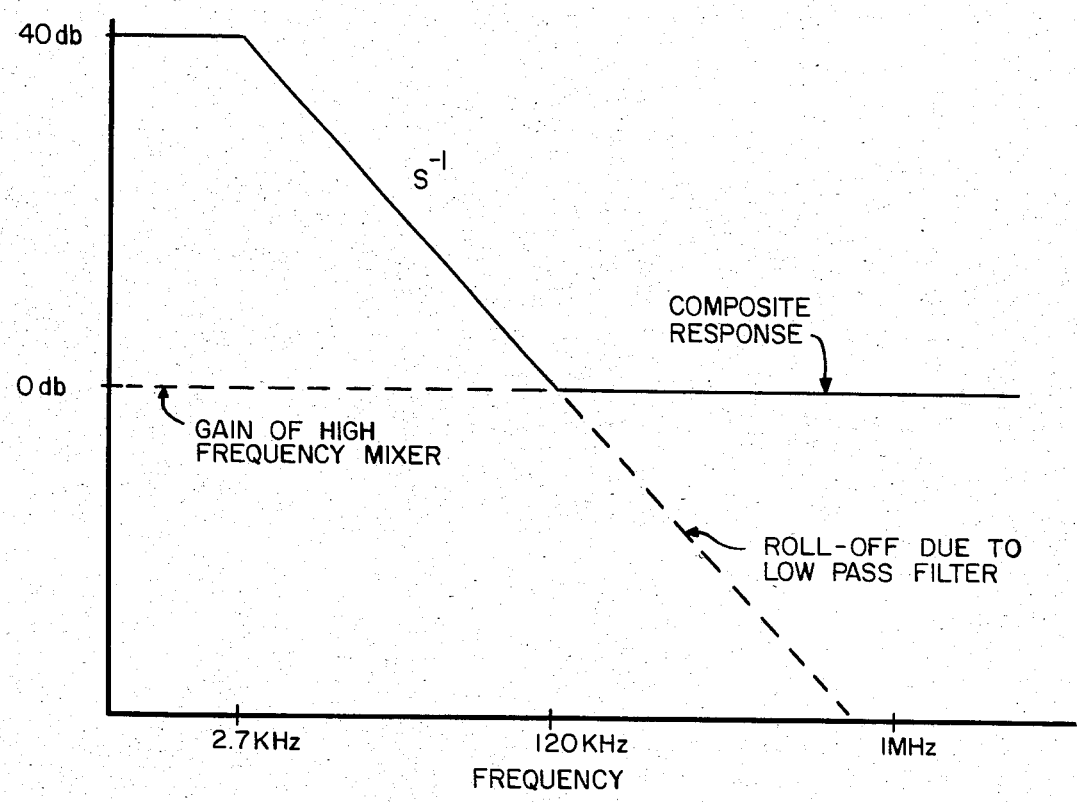
FIG. 5 is a graphical representation of the composite response of the waveforms of FIGS. 3 and 4 wherein gain of high frequency mixer and the roll-off due to the low pass filter are combined.

It may therefore be noted that the present wide-band phase locked loop amplifier apparatus utilizes two mixer units in combination with an integrating amplifier and two signal splitting networks to achieve negligible phase delay at the loop bandwidth. The low frequency path contains the loop integrator amplifier to provide gain, while making a type two phase locked loop at frequencies below the break frequency of the active amplifier. The graphic representation of gain/frequency response of this loop is shown in FIG. 3. The output of the active loop amplifier which is low passed by an R-C filter network is shown in FIG. 4 as having a common break frequency with the graphic representation that was shown in FIG. 3. The composite gain/frequency graphic representation (FIGS. 3 and 4 waveforms combined) is shown in FIG. 5, wherein the composite waveform results in the continued roll-off of the amplifier response. The high frequencies from the second mixer are allowed to directly modulate the voltage controlled oscillator unit (VCO) with no phase delay at unity gain. At the loop bandwidth, the gain of the high frequency mixer is 14 to 20 db greater than the low frequency path (depending on the break frequency that is used) making the composite response essentially the second mixer response. The break-frequencies were chosen to be 10 to 20% of the loop bandwidth in order to maximize the noise suppression of the voltage controlled oscillator unit (VCO) while minimizing the phase contribution of the low frequency path. This technique which requires an additional mixer and a pair of power splitters, can be implemented whenever high frequency gain is not needed.

Figure 6A:
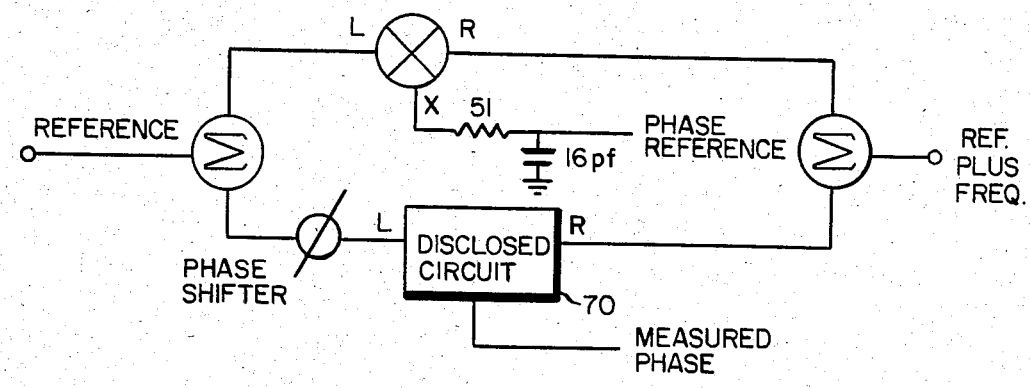
FIG. 6a is a schematic diagram of the test circuit which was utilized to measure the phase delay of the present invention.
Figure 6B:
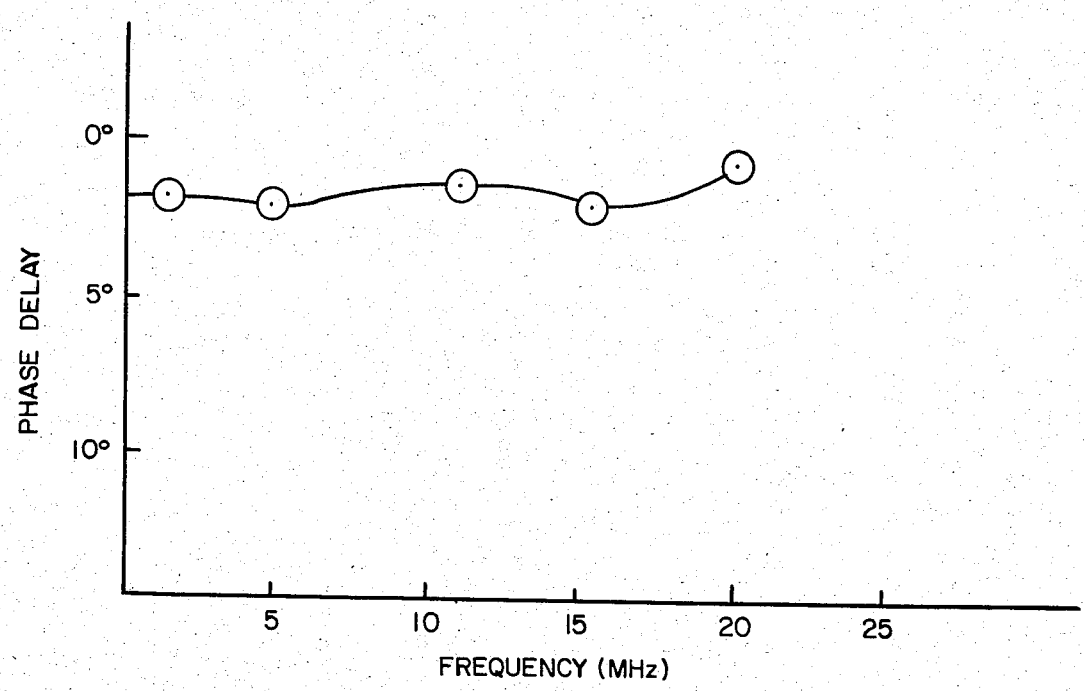
FIG. 6b is a graphical representation of the measured phase delay of the present invention operating at L-band.

Phase measurements were taken using a vector voltmeter and were found to be negligible as expected. There is shown in FIG. 6a the test set-up which was utilized to measure the phase delay in the present invention that is indicated as block 70. The results of the phase delay measurements are shown in FIG. 6b wherein the phase delay is essentially zero. Zero phase was established by using an external mixer as the reference source and adjusting the phase to equal the low frequency mixer output. The phase delay which was measured at the output of the second mixer, would come from the active loop amplifier and low pass filter. In order to demonstrate the operation of the closed loop amplifier, a 5 MHz loop was built and tested at L-band. The L-band voltage controlled oscillator unit was locked to a reference in the phase locked loop.

Although the invention has been described with reference to a particular embodiment, it will be understood to those skilled in the art that the invention is capable of a variety of alternative embodiments within the spirit and scope of the appended claims.

What is claimed is:

1. A wide-band phase locked loop amplifier apparatus comprising in combination:

a first summing means to receive an RF reference signal, said first summing means having a first and second output port, a first mixer means having a first input port to receive said RF reference signal from said second output port of said first summing means, said first mixer means having a second input port and a first and second output port, said first output port connected to ground, an amplifier means connected to said second output port of said first mixer means to receive the first composite signal therefrom at its noninverting input terminal, said amplifier means having an inverting terminal and an output terminal, a filter means connected to said output terminal of said amplifier means to receive the output signal therefrom, said filter means filtering said output signal, a second mixer means receiving said output signal from said filter means at its first input port, said second mixer means having a second input port, a third input port and an output port, said second input port of said second mixer means receiving said RF reference signal from said first output port of said first summing means, said second mixer means providing a second composite signal at said output port, a voltage controlled oscillator means receiving said second composite signal at its tuning port, said voltage controlled oscillator means providing an RF signal at its output port, and, a second summing means receiving said RF signal from said voltage controlled oscillator at a first input port, said second summing means having a first and second output port, said second summing means applying said RF signal through said second output port to said third input port of said second mixer means such that said second mixer means combines all received input signals to form said second composite signal, said second summing means applying said RF signal through said third output port to said second input port of said first mixer means such that the received signals are combined to form said first composite signal.

2. A wide-band phase locked loop amplifier apparatus as described in claim 1 wherein said amplifier means comprises an operational amplifier with a feedback means connected between its output terminal and its inverting input terminal.

3. A wide-band phase locked loop amplifier apparatus as described in claim 2 wherein said feedback means comprises a resistor/capacitor network to form an integrator.

4. A wide-band phase locked loop amplifier apparatus as described in claim 3 wherein said filter means comprises a low pass filter network.

5. A wide-band phase locked loop amplifier apparatus as described in claim 4 wherein said low pass filter network comprises a resistor/capacitor filter.

6. A wide-band phase locked loop amplifier apparatus as described in claim 5 wherein the first circuit loop defined by said first summing means and said second mixer means forms a high frequency path with unity gain.

7. A wide-band phase locked loop amplifier apparatus as described in claim 5 wherein said second circuit loop defined by said first mixer means, said amplifier means, said filter means, said second mixer means, said voltage controlled oscillator means and said second summing means forms a low frequency path.

* * * * *